United States Patent
Yang et al.

(10) Patent No.: US 6,680,231 B1
(45) Date of Patent: Jan. 20, 2004

(54) HIGH-VOLTAGE DEVICE PROCESS COMPATIBLE WITH LOW-VOLTAGE DEVICE PROCESS

(75) Inventors: Jia-Wei Yang, Hsinchu (TW); Chih-Cherng Liao, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 10/301,686

(22) Filed: Nov. 22, 2002

(30) Foreign Application Priority Data

Aug. 6, 2002 (TW) ........................................ 91117643 A

(51) Int. Cl.[7] .......................................... H01L 21/336
(52) U.S. Cl. .................... 438/268; 438/286; 438/289
(58) Field of Search ................. 438/133, 138, 438/212, 268, 275, 286, 289

(56) References Cited

U.S. PATENT DOCUMENTS

| | | | | |
|---|---|---|---|---|
| 5,242,841 A | * | 9/1993 | Smayling et al. | 438/268 |
| 5,322,804 A | * | 6/1994 | Beasom | 438/286 |
| 6,124,159 A | | 9/2000 | Chu | 438/275 |
| 6,222,235 B1 | * | 4/2001 | Kojima et al. | 257/355 |
| 6,258,674 B1 | * | 7/2001 | Kwon et al. | 438/286 |
| 6,306,711 B1 | * | 10/2001 | Yang | 438/286 |

* cited by examiner

*Primary Examiner*—Chandra Chaudhari
(74) *Attorney, Agent, or Firm*—Birch, Stewart, Kolasch & Birch, LLP

(57) ABSTRACT

A high-voltage device process compatible with a low-voltage device process. A high-voltage device area and a low-voltage device area are defined on an epitaxial layer of a semiconductor substrate. After forming a plurality of first gate structures on the high-voltage device area, a P-body is formed in the epitaxial layer between two adjacent first gate structures. Then, a plurality of second gate structures is formed on the low-voltage device area.

17 Claims, 5 Drawing Sheets

HIGH-VOLTAGE DEVICE PROCESS COMPATIBLE WITH LOW-VOLTAGE DEVICE PROCESS

This nonprovisional application claims priority under 35 U.S.C. §119(a) on patent application Ser. No. 091117643 filed in TAIWAN on Aug. 6, 2002, which is herein incorporated by reference.

BACKGROUND OF THE INVENTION

1. Field of the Invention

The present invention relates to a high-voltage device process and, more particularly, to a high-voltage device process compatible with a low-voltage device process, in which a gate structure and a P-body are formed within a high-voltage device area and then a gate structure is formed within a low-voltage device area.

2. Description of the Related Art

In current semiconductor processing, controllers, memories, circuits of low-voltage operation and power devices of high-voltage operation are largely integrated into a single chip to achieve a single-chip system. The power device, such as VDMOS, IGBT and LDMOS, is employed to increase power switching efficiency and decrease the loss of energy resources. Since the high-voltage device and the low-voltage device with different breakdown voltages are required on a single chip, making the high-voltage device process compatible with the low-voltage device process has become an important issue.

In high-voltage device processing, a P-body is required by an epitaxial layer to achieve a high breakdown voltage. Conventionally, the P-body is formed by a self-alignment P-body process after the gate structures are formed in the high-voltage device area and the low-voltage device area. FIGS. 1A and 1B are sectional diagrams showing the conventional self-alignment P-body process. As shown in FIG. 1A, in a case using a P-type semiconductor silicon substrate 10, a high-voltage device area H and a low-voltage device area L are defined on the substrate 10. Also, an N-type epitaxial layer 12 is formed on the substrate 10, a field oxide layer 14 is formed in the epitaxial layer 12 within the high-voltage device area H, and a P-type well 16 is formed in the epitaxial layer 12 within the low-voltage device area L. In patterning gate structures on the epitaxial layer 12, a gate oxide layer 18, a polysilicon layer 20 and a metal silicide layer 22 are deposited and then etched by photolithography to provide two gate structures within the high-voltage device area H and the low-voltage device area L, respectively.

Next, as shown in FIG. 1B, a self-alignment P-body process with P-type ion implantation and thermal annealing is carried out in the high-voltage device area H to form a P-body 24 in the epitaxial layer 12 in the high-voltage device area H. In order to obtain channel length $L_D$, considerable thermal budget is required to drive the P-type ions to laterally diffuse under the gate structure, resulting in a preferred laterally-extending length. However, the large thermal budget may vary the original distribution of ions and the junction profile within the low-voltage device area L, causing problems related to the threshold voltage, the saturated circuits and the resistance of the well region of the low-voltage device.

SUMMARY OF THE INVENTION

The present invention provides a high-voltage device process compatible with a low-voltage device process to solve the problems caused by the prior method.

In the high-voltage device process compatible with a low-voltage device process, a high-voltage device area and a low-voltage device area are defined on an N-type epitaxial layer of P-type semiconductor silicon substrate. Then, an ion implantation modulating threshold voltage is employed on predetermined gate structure areas within the high-voltage device area. Next, a plurality of first gate structures are patterned on the predetermined gate structure areas within the high-voltage device area, in which each first gate structure is stacked by a first gate oxide layer and a first polysilicon layer. Next, a $P^+$-type ion implantation and a thermal annealing are performed on the high-voltage device area to form a P-body in the epitaxial layer between two adjacent first gate structures. Finally, a plurality of second gate structures are formed on the low-voltage device area, in which each second gate structure is stacked by a second gate oxide layer, a second polysilicon layer and a metal silicide layer.

Accordingly, it is a principal object of the invention to provide first gate structure in the high-voltage device area and the second gate structure in the low-voltage device area in different steps.

It is another object of the invention to prevent problems related to the threshold voltage, the saturated circuits and the resistance of the well region of the low-voltage device caused by the thermal budget required by the formation of the P-body.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE INVENTION

Figure 1A:
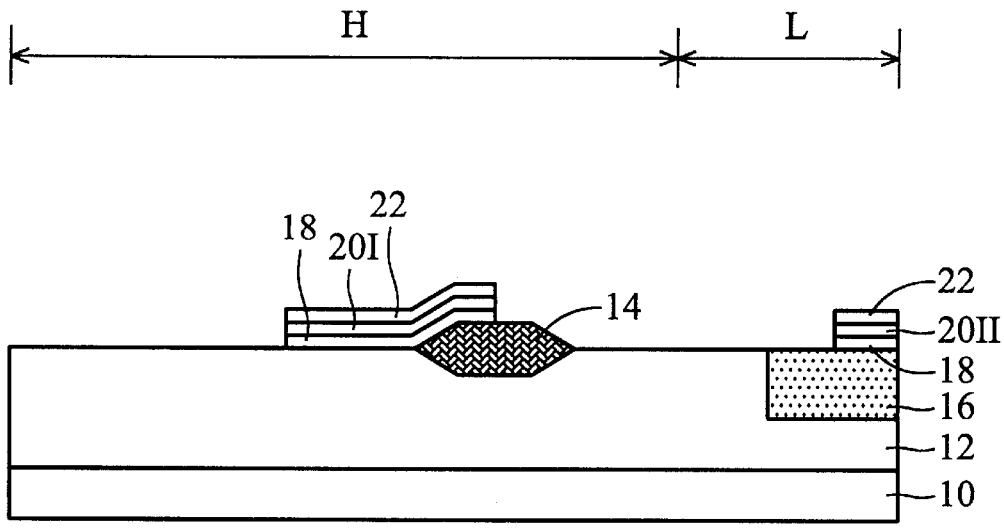
FIGS. 1A and 1B are sectional diagrams showing the conventional self-alignment P-body process.
Figure 1B:
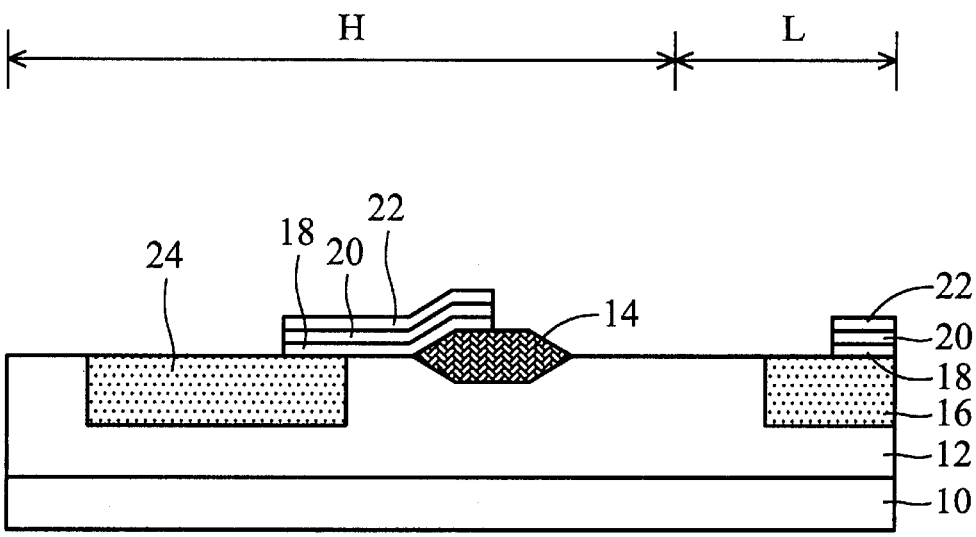
Figure 2A:
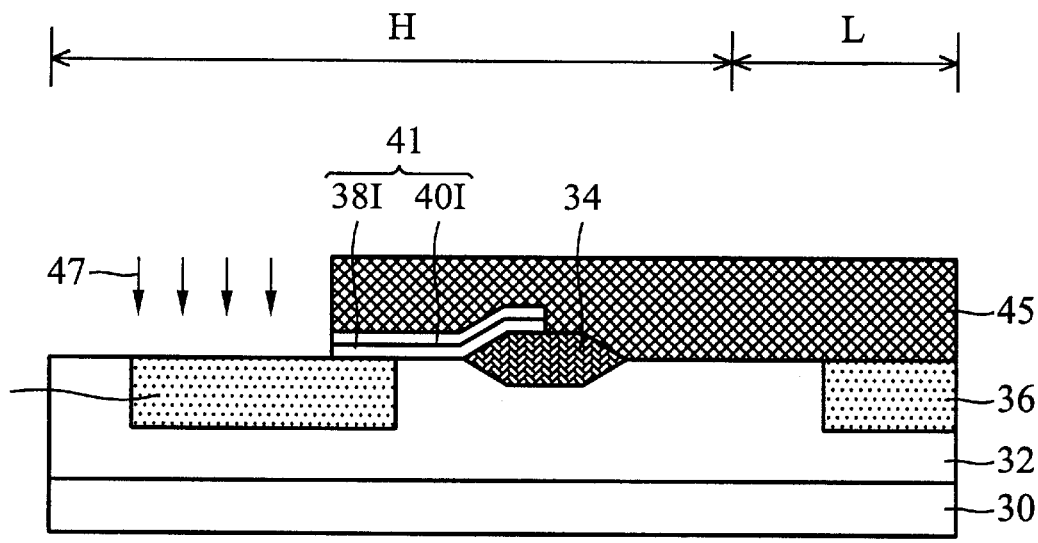
FIGS. 2A and 2B are sectional diagrams showing the self-alignment P-body process of the present invention.
Figure 2B:
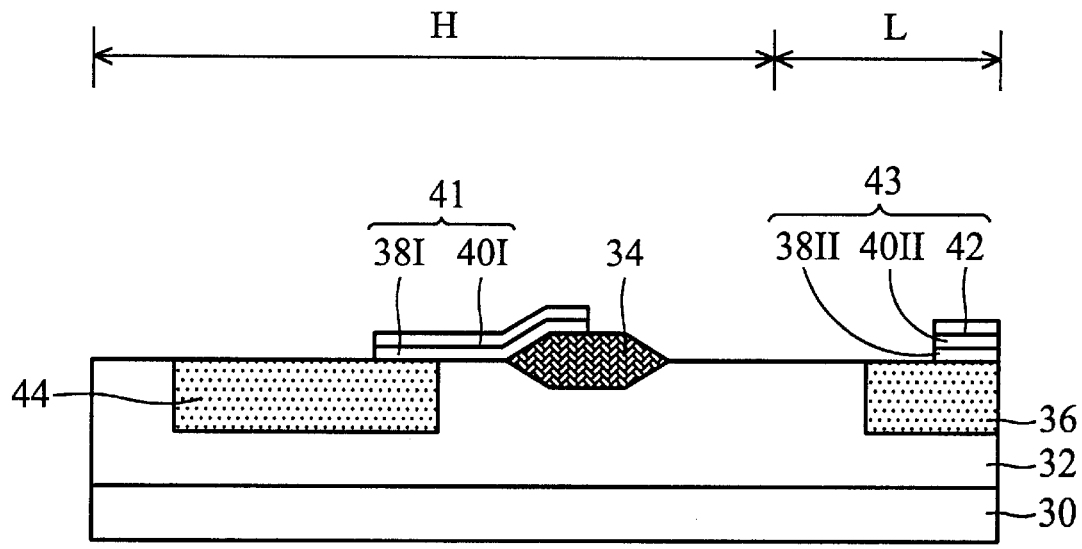

FIGS. 2A and 2B are sectional diagrams showing the self-alignment P-body process of the present invention. As shown in FIG. 2A, in a case using a P-type semiconductor silicon substrate 30, a high-voltage device area H and a low-voltage device area L are defined on the substrate 30. Also, an N-type epitaxial layer 32 is formed on the substrate 30, a field oxide layer 34 is formed in the epitaxial layer 32 within the high-voltage device area H, and a P-type well 36 is formed in the epitaxial layer 32 within the low-voltage device area L.

First, a first gate structure 41, stacked by a first gate oxide layer 38I and a first polysilicon layer 40I, is formed on a predetermined area of the epitaxial layer 32 within the high-voltage device area H. Then, a photoresist layer 45 is provided to cover the entire surface of the low-voltage device area L and a part of the high-voltage device area H, resulting in exposure of an area outside the first gate structure 41. Next, using a self-alignment P-body process 47 within the high-voltage device area H, the P-type ion implantation and thermal annealing are carried out to form a P-body 44 in the exposed region of the epitaxial layer 32 within the high-voltage device area H.

Thereafter, as shown in FIG. 2B, when the photoresist layer 45 is removed, deposition, photolithography and etching are employed to form a second gate structure 43 on the P-type well 36 within the low-voltage device area L. The second gate structure 43 is stacked by a second gate oxide layer 38II, a second polysilicon layer 40II and a metal silicide layer 42. Preferably, the metal silicide layer 42 is $WSi_x$.

Compared with the prior method, the first gate structure 41 and the P-body 44 within the high-voltage device area H are formed prior to the formation of the second gate structure 43 within the low-voltage device area L in the present invention. Thus, the thermal budget required by the formation of the P-body 44 cannot cause problems related to the threshold voltage, the saturated circuits, or the resistance of the well region of the low-voltage device within the low-voltage device area L. Also, since the first gate structure 41 and the second gate structure 43 are formed in different steps, the metal silicide layer 42 is only patterned on the second gate structure 43, not on the first gate structure 41.

Hereinafter, the self-alignment P-body process used in the high-voltage device process is described in detail. FIGS. 3A to 3F are sectional diagrams showing the high-voltage device process of the present invention.

Figure 3A:
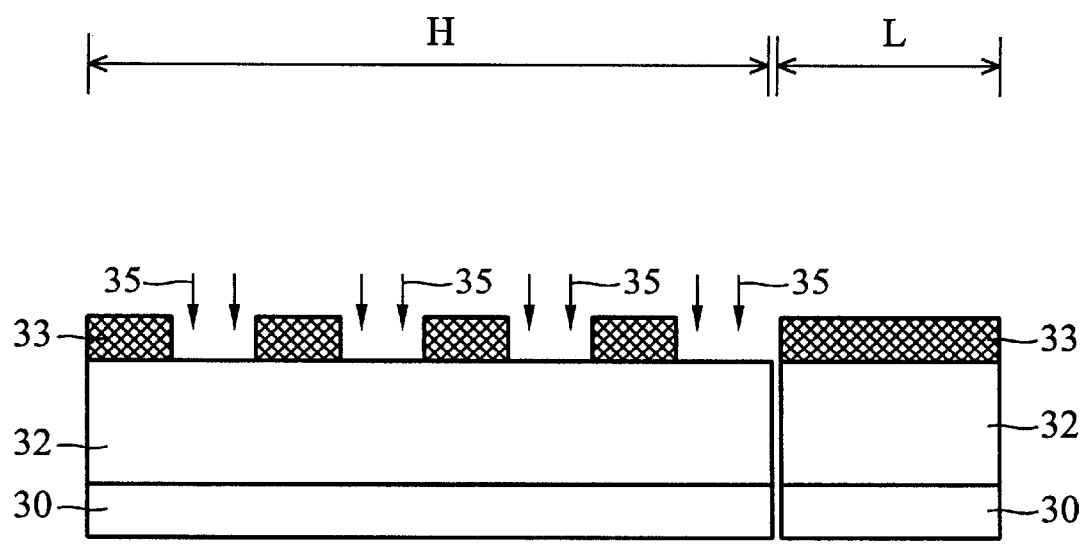
FIGS. 3A to 3F are sectional diagrams showing the high-voltage device process of the present invention.

As shown in FIG. 3A, a first photoresist layer 33 is provided on the epitaxial layer 32 to cover the entire surface of the low-voltage device area L and a part of the high-voltage device area H, resulting in exposure of areas of predetermined gate structures within the high-voltage device area H. Then, using the first photoresist layer 33 as a mask, an ion implantation for modulating threshold voltage is carried out in the high-voltage device area H. Next, the photoresist layer 33 is removed.

Figure 3B:
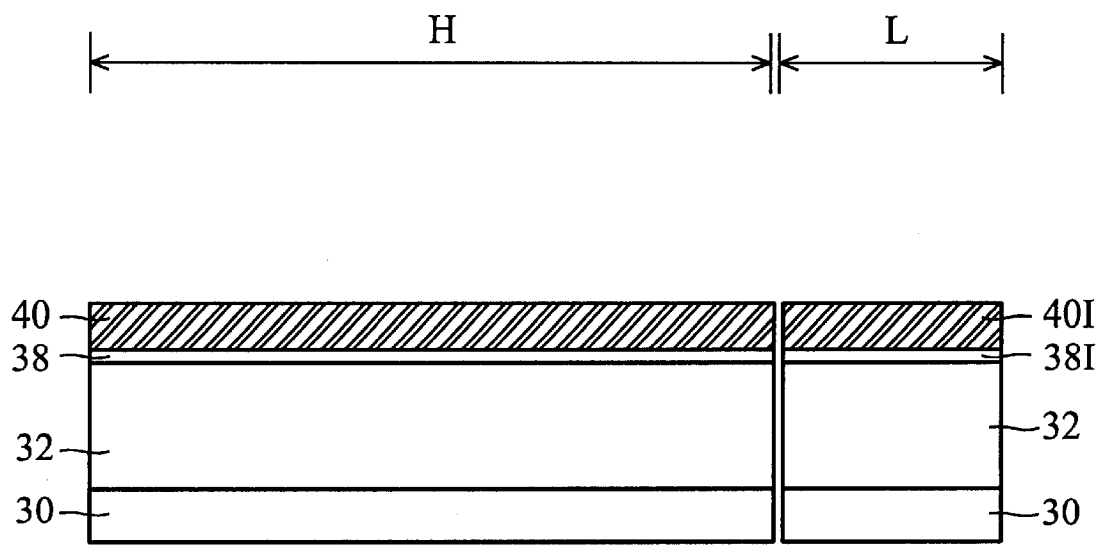
Figure 3C:
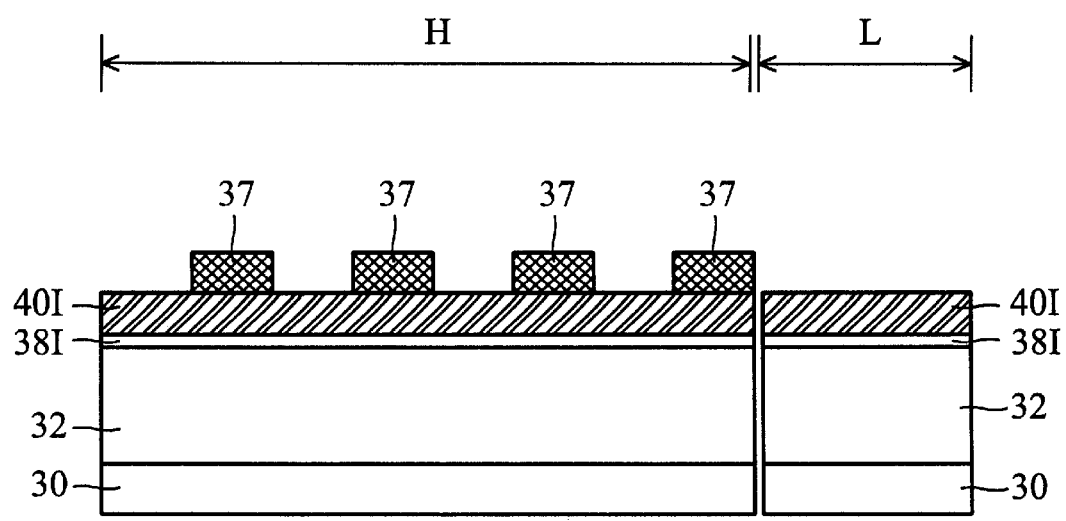
Figure 3D:
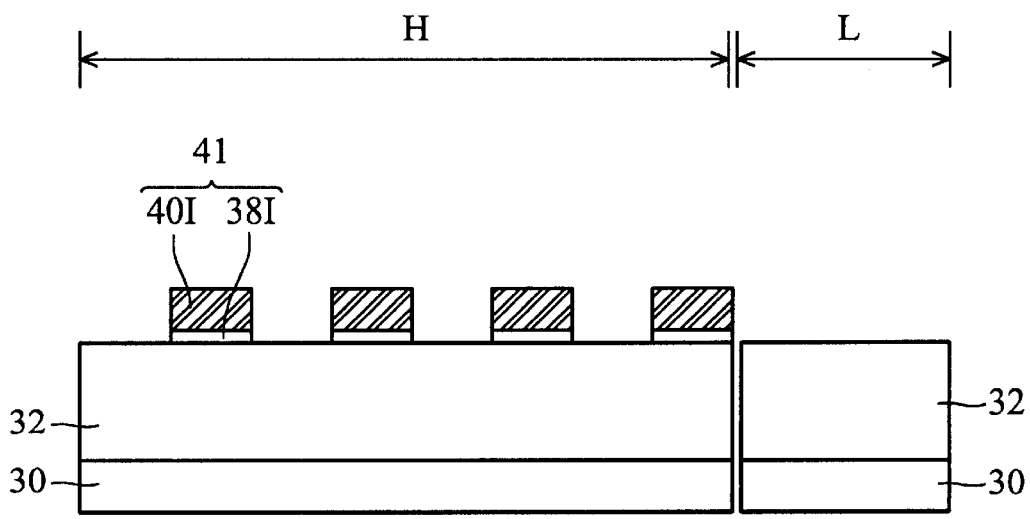

As shown in FIG. 3B, the first gate oxide layer 38I and the first polysilicon layer 40I are successively deposited on the entire surface of the epitaxial layer 32. Then, as shown in FIG. 3C, a second photoresist layer 37 is provided on the first polysilicon layer 40I to define the pattern of gate structures within the high-voltage device area H. Next, as shown in FIG. 3D, using etching with the second photoresist layer 37 as amask, the exposed regions of the first polysilicon layer 40I and the first gate oxide layer 38I are removed, resulting in a plurality of first gate structures 41 within the high-voltage device area H. In the meanwhile, within the low-voltage device area L, the first polysilicon layer 40I and the first gate oxide layer 38I are completely removed to expose the entire surface of epitaxial layer 32. Thereafter, the second photoresist layer 37 is removed.

Figure 3E:
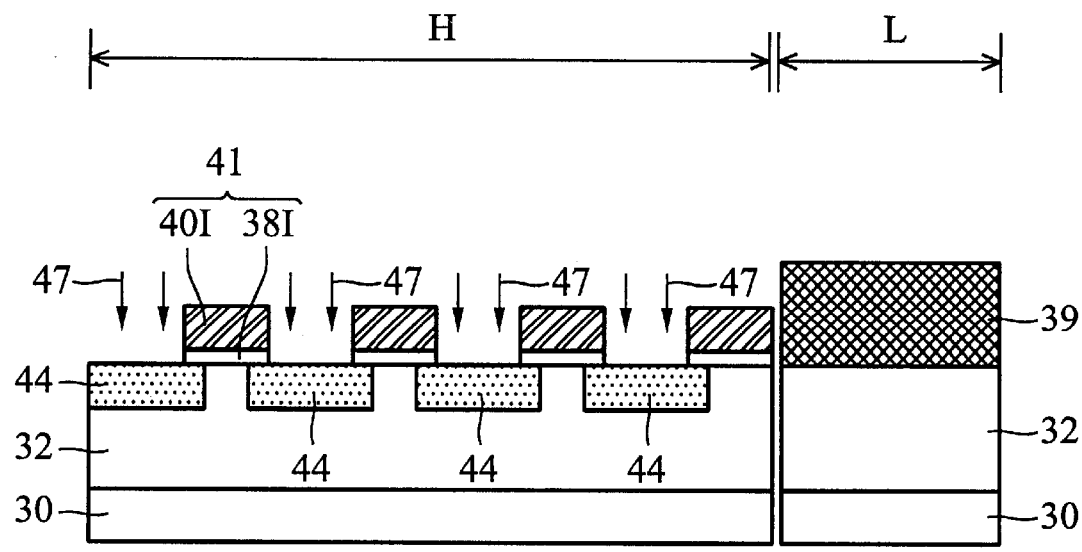

As shown in FIG. 3E, a third photoresist layer 39 is provided to cover the epitaxial layer 32 within the low-voltage device area L. Then, using the self-alignment P-body process 47 with the first gate structures 41 as masks, the P-type ion implantation and thermal annealing are carried out to form the P-body 44 in the epitaxial layer 32 adjacent to the first gate structure 41. Next, the third photoresist layer 39 is removed.

Figure 3F:
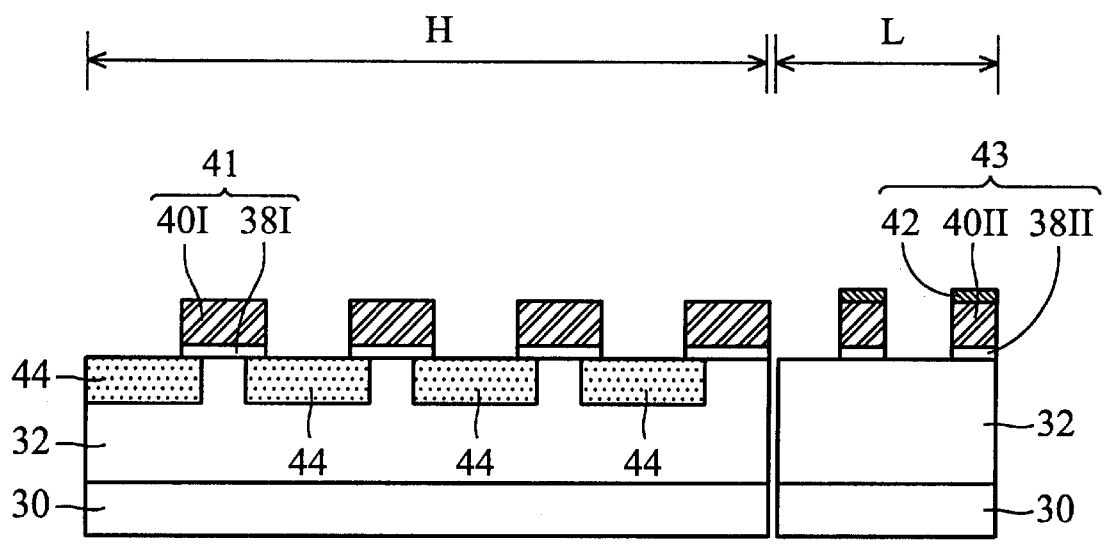

As shown in FIG. 3F, the second gate oxide layer 38II, the second polysilicon layer 40II and the metal silicide layer 42 are successively deposited on the entire surface of the high-voltage device area H and the low-voltage device area L. Then, using photolithography and etching, the metal silicide layer 42, the second polysilicon layer 40II and the second gate oxide layer 38II are patterned to create a plurality of second gate structures 43 within the low-voltage device area L. Meanwhile, within the high-voltage device area H, the metal silicide layer 42, the second polysilicon layer 40II and the second gate oxide layer 38II are completely removed.

It is to be understood that the present invention is not limited to the embodiments described above, but encompasses any and all embodiments within the scope of the following claims.

What is claimed is:

1. A high-voltage device process compatible with a low-voltage device process, comprising steps of:

providing a semiconductor silicon substrate of a first conductive type, on which a high-voltage device area and a low-voltage device area are defined, and an epitaxial layer of a second conductive type is formed;

performing an ion implantation for modulating threshold voltage on predetermined gate structure areas within the high-voltage device area;

forming a plurality of first gate structures on the predetermined gate structure areas within the high-voltage device area, in which each first gate structure is stacked by a first gate oxide layer and a first polysilicon layer;

performing an ion implantation with dopants of the first conductive type and a thermal annealing on the high-voltage device area to form an ion diffusion region in the epitaxial layer between two adjacent first gate structures; and forming a plurality of second gate structures within the low-voltage device area, in which each second gate structure is stacked by a second gate oxide layer, a second polysilicon layer and a metal silicide layer.

2. The high-voltage device process compatible with a low-voltage device process according to claim 1, wherein the first conductive type is P type, and the second conductive type is N type.

3. The high-voltage device process compatible with a low-voltage device process according to claim 1, wherein the ion diffusion region is $P^+$ type.

4. The high-voltage device process compatible with a low-voltage device process according to claim 1, wherein the ion implantation for modulating threshold voltage comprises:

providing a first photoresist layer on the epitaxial layer to cover the entire surface of the low-voltage device area and a region outside the predetermined gate structure area of the high-voltage device area;

using the first photoresist layer as a mask, the ion implantation or modulating threshold voltage is performed on the predetermined gate structure area of the high-voltage device area; and removing the first photoresist layer.

5. The high-voltage device process compatible with a low-voltage device process according to claim 1, wherein the formation of the first gate structure in the high-voltage device area comprises:

successively depositing the first gate oxide layer and the first polysilicon layer on the entire surface of the epitaxial layer;

providing a second photoresist layer on the first polysilicon layer within the high-voltage device area to define the pattern of the first gate structure;

patterning the first gate oxide layer and the first polysilicon layer as the first gate structure within the high-voltage device area using etching with the second photoresist layer as a mask, such that the first gate oxide layer and the first polysilicon layer within the low-voltage device area are completely removed; and removing the second photoresist layer.

6. The high-voltage device process compatible with a low-voltage device process according to claim 1, wherein the formation of the ion diffusion region within the high-voltage device area comprises:

providing a third photoresist layer to cover the entire surface of the low-voltage device area;

forming the ion diffusion region in the epitaxial layer using the ion implantation with dopants of the first conductive type and the thermal annealing with the first gate structure as a mask, between two adjacent first gate structures within the high-voltage device area; and removing the third photoresist layer.

7. The high-voltage device process compatible with a low-voltage device process according to claim 1, wherein the formation of the second gate structure in the low-voltage device area comprises:

successively depositing the second gate oxide layer, the second polysilicon layer and the metal silicide layer on the entire surface of the substrate; and etching the second gate oxide layer, the second polysilicon layer and the metal silicide layer to serve as the second gate structure within the low-voltage device area, such that the second polysilicon layer and the metal silicide layer within the high-voltage device area are completely removed.

8. The high-voltage device process compatible with a low-voltage device process according to claim 1, wherein the metal silicide layer is $WSi_x$.

9. The high-voltage device process compatible with a low-voltage device process according to claim 1, wherein the epitaxial layer comprises a well of the first conductive type under the second gate structure in the low-voltage device area.

10. The high-voltage device process compatible with a low-voltage device process according to claim 1, wherein the epitaxial layer comprises a plurality of field oxide layers.

11. A high-voltage device process compatible with a low-voltage device process, comprising steps of:

providing a P-type semiconductor silicon substrate, on which a high-voltage device area and a low-voltage device area are defined, and an N-type epitaxial layer is formed;

performing an ion implantation modulating threshold voltage on predetermined gate structure areas within the high-voltage device area;

forming a plurality of first gate structures on the predetermined gate structure areas within the high-voltage device area, in which each first gate structure is stacked by a first gate oxide layer and a first polysilicon layer;

performing a $P^+$-type ion implantation and a thermal annealing on the high-voltage device area to form a P-body in the epitaxial layer between two adjacent first gate structures; and forming a plurality of second gate structures within the low-voltage device area, in which each second gate structure is stacked by a second gate oxide layer, a second polysilicon layer and a metal silicide layer.

12. The high-voltage device process compatible with a low-voltage device process according to claim 11, wherein the ion implantation for modulating threshold voltage comprises:

providing a first photoresist layer on the epitaxial layer to cover the entire surface of the low-voltage device area and a region outside the predetermined gate structure area of the high-voltage device area;

performing the ion implantation or modulating threshold voltage on the predetermined gate structure area of the high-voltage device area using the first photoresist layer as a mask; and removing the first photoresist layer.

13. The high-voltage device process compatible with a low-voltage device process according to claim 11, wherein the formation of the first gate structure in the high-voltage device area comprises:

successively depositing the first gate oxide layer and the first polysilicon layer on the entire surface of the epitaxial layer;

providing a second photoresist layer on the first polysilicon layer within the high-voltage device area to define the pattern of the first gate structure;

patterning the first gate oxide layer and the first polysilicon layer as the first gate structure within the high-voltage device area using etching with the second photoresist layer as a mask, such that the first gate oxide layer and the first polysilicon layer within the low-voltage device area are completely removed; and removing the second photoresist layer.

14. The high-voltage device process compatible with a low-voltage device process according to claim 11, wherein the formation of the P-body within the high-voltage device area comprises:

providing a third photoresist layer to cover the entire surface of the low-voltage device area;

forming the P-body in the epitaxial layer between two adjacent first gate structures within the high-voltage device area using the $P^+$-type ion implantation and the thermal annealing with the first gate structure as a mask; and removing the third photoresist layer.

15. The high-voltage device process compatible with a low-voltage device process according to claim 11, wherein the formation of the second gate structure in the low-voltage device area comprises:

successively depositing the second gate oxide layer, the second polysilicon layer and the metal silicide layer on the entire surface of the substrate; and etching the second gate oxide layer, the second polysilicon layer and the metal silicide layer to serve as the second gate structure within the low-voltage device area, such that the second polysilicon layer and the metal silicide layer within the high-voltage device area are completely removed.

16. The high-voltage device process compatible with a low-voltage device process according to claim 11, wherein the epitaxial layer comprises a P-type well under the second gate structure in the low-voltage device area.

17. The high-voltage device process compatible with a low-voltage device process according to claim 11, wherein the epitaxial layer comprises a plurality of field oxide layers.

* * * * *